United States Patent
Naumann et al.

(10) Patent No.: US 8,328,045 B2
(45) Date of Patent: Dec. 11, 2012

(54) HOUSING

(75) Inventors: Reiner Naumann, Mannheim (DE);
Gerhard Schwarz, Schönbrunn (DE);
Gert Hofmann, Eberbach (DE)

(73) Assignee: Cooper Crouse-Hinds GmbH, Soest (DE)

( * ) Notice: Subject to any disclaimer, the term of this patent is extended or adjusted under 35 U.S.C. 154(b) by 625 days.

(21) Appl. No.: 12/514,010

(22) PCT Filed: Aug. 30, 2007

(86) PCT No.: PCT/EP2007/007589
§ 371 (c)(1),
(2), (4) Date: Jun. 2, 2009

(87) PCT Pub. No.: WO2008/055557
PCT Pub. Date: May 15, 2008

(65) Prior Publication Data
US 2009/0308863 A1 Dec. 17, 2009

(30) Foreign Application Priority Data
Nov. 8, 2006 (DE) .......................... 10 2006 052 723

(51) Int. Cl.
*B65D 43/22* (2006.01)
(52) U.S. Cl. .......... 220/830; 220/3.7; 220/3.8; 220/811; 220/812
(58) Field of Classification Search ............ 220/3.7, 220/3.8, 811, 812, 830
See application file for complete search history.

(56) References Cited

U.S. PATENT DOCUMENTS

| 6,032,420 A | 3/2000 | Daoud |
| 6,135,130 A * | 10/2000 | Martineau ............ 134/113 |
| 2004/0173622 A1 * | 9/2004 | Findleton ............ 220/695 |

FOREIGN PATENT DOCUMENTS

| CH | 470598 | 3/1969 |
| DE | 9216735.7 | 2/1993 |
| FR | 2.099.120 | 6/1971 |

OTHER PUBLICATIONS

International Search Report (Application No. PCT/EP2007/007589); mailed Feb. 6, 2008; 3 pages.

* cited by examiner

*Primary Examiner* — Anthony Stashick
*Assistant Examiner* — Elizabeth Volz
(74) *Attorney, Agent, or Firm* — Fish & Richardson P.C.

(57) ABSTRACT

An explosion-proof housing includes at least one lower housing part which is provided with a housing wall defining a housing opening that can be closed by an articulated cover. The articulated cover is mounted by an articulation device to be pivotable between an opened and a closed position. In order to allow both a closely adjacent arrangement of housings and the complete utilization of the housing interior, the articulation device includes a lower articulation part arranged in the housing wall, and an upper articulation part arranged on a lower side of the articulated cover which faces the housing opening in a closed position. The lower articulation part and the upper articulation part are pivotably interconnected.

25 Claims, 5 Drawing Sheets

HOUSING

The invention relates to a housing, especially to an explosion-proof housing, comprising at least one lower housing part which is provided with a housing wall and has a housing opening that can be closed by an articulated cover, wherein the articulated cover is mounted by means of an articulation device to be pivotable between an opened position and a closed position.

Such housings serve, for example, the installation of terminals of intrinsically safe and non-intrinsically safe electric circuits. The housings are designed explosion-proof according to the protection grades Ex-e and Ex-i, respectively. Materials for such housings are, for example, metal, in particular stainless steel, or a synthetic material, especially polyester or glass-fiber reinforced polyester.

Basically, two different types of such housings are known in practice. A first type of housing is provided on an outer side of the housing wall with a corresponding articulation device for pivoting an articulated cover between an opened and a closed position relative to a housing opening of the housing. This permits the arrangement of two housings within the region of this articulation device so close to each other that the housing walls are in contact. Although this type of articulation device allows the utilization of the total interior space of the housing for the installation of corresponding electric and electronic devices, the provision of such an extreme articulation device requires at least a certain clearance between adjacent housings.

A second type of housing has articulation devices provided in the interior space, so that these housings can be arranged at least closely adjacent to each other and side by side, with the corresponding housing walls being in contact. However, the arrangement of the articulation device in the interior of the housing reduces the space for mounting electric and electronic devices therein.

The invention is based on the object to improve a housing of the above-described type to permit both a closely adjacent arrangement of housings and the complete utilization of the housing interior.

This object is achieved with the features of patent claim 1.

According to the invention, the articulation device is arranged neither externally nor internally. Instead, the articulation device comprises a lower articulation part which is arranged directly in the housing wall, and an upper articulation part arranged on a lower side of the articulated cover which faces the housing opening in a closed position. The lower articulation part and the upper articulation part are pivotably interconnected.

By arranging the lower articulation part inside the housing wall it is neither required to observe a certain clearance if two housings or several housings are placed side by side, nor does this arrangement reduce the interior space of the housing in any way. The housing wall of such housings is already provided with a sufficient wall thickness as, for example, stud bolts can be screwed in from above through the articulated cover into the housing wall to fix the articulated cover in the closed position.

In order to permit a simple embodiment of the lower articulation part and, at the same time, the reception thereof in the housing wall, the lower articulation part may be formed as an articulation rod which is at least partially inserted into a receiving borehole in the housing wall. Such an articulation rod may have various cross-sections, wherein simple cross-sections such as circular, quadrangular ones or the like are preferred.

A further advantage of cross-sections that are not round is that the articulation rod is arranged in a receiving borehole of a corresponding cross-section in a substantially non-rotary manner.

In this connection, the articulation rod is pivotably connected to the upper articulation part in a corresponding manner.

In order to be able to easily open the articulated cover even if the housings are arranged closely side by side, the lower articulation part may be mounted in the receiving borehole to be displaceable in the longitudinal direction of the borehole. Thus, the lower articulation part can be drawn out of the receiving borehole when the articulated cover is opened, so that an arrangement of the articulated cover in its opened position with a greater distance relative to the lower housing part is possible also within in the region of the articulation device, with the result that it is more easily pivotable relative to the adjacent housings.

A simple possibility to interconnect the articulation rod and the upper articulation part can be achieved by pivotably connecting the articulation rod at its articulation end projecting out of the receiving borehole to the upper articulation part. A corresponding pivotable connection may be realized by a mounting eye at the articulation end of the articulation rod and an eye receiving slot on the upper articulation part.

Especially in view of explosion protection it is an advantage if, in the closed position, the articulated cover is arranged as closely as possible on the lower housing part. This can be achieved in an easy manner, for example, by arranging the articulation rod together with the upper articulation part in a retracted position substantially inside the receiving borehole in a closed position. The cross-section of the upper articulation part is here formed complementarily with respect to the cross-section of the receiving borehole, so that in the closed position of the articulated cover the upper articulation part is likewise arranged inside the receiving borehole as much as possible.

To allow an easier arrangement of the articulation rod inside the receiving borehole when the articulated cover is in a closed position, and to allow the opening of the articulated cover out of a closed position against a corresponding force, the articulation rod may be acted on by a force in the direction of the retracted position.

One possibility of applying a force is, for example, a telescope-like articulation rod, which is provided with a corresponding restoring device in its interior. Another possibility to apply such a force is a spring element, which may be arranged in various ways. In the simplest case, it acts between the articulation rod and the housing wall, wherein the spring element may be mounted at or on the articulation rod and may be fixed between the latter and a portion of the receiving borehole.

The corresponding spring element may, in this connection, be embodied as a helical spring. Depending on the arrangement of the spring element relative to the articulation rod and the receiving borehole, the helical spring is a helical tension spring or a helical compression spring. If a helical compression spring is employed, it is compressed by the displacement of the articulation rod out of the receiving borehole when the articulated cover is opened, so that the spring exerts a pressure on the articulation rod in the direction of the closed position of the articulated cover. A helical tension spring is extended upon the displacement of the articulation rod when the articulated cover is opened, and it exerts a tension on the articulation rod in the direction of the closed position of the articulated cover.

In order to also allow a subsequent mounting of the articulated cover of the housing on the housing by means of the articulation device, if required, the receiving borehole may be provided with at least one recess, which is open substantially transversely to the longitudinal direction of the borehole toward the outer side of the housing wall. The corresponding articulation rod can be inserted together with the articulated cover or the lid from the open end of the receiving borehole. The articulation rod can then be displaced in the receiving borehole until a corresponding lower end of the articulation rod is located in the open recess. Thus, specifically the spring element can then be inserted from the outer side of the housing wall, thereby allowing a detachable attachment of the articulation rod inside the receiving borehole.

This step is performed reversely when the articulated cover is detached or arranged differently relative to the lower housing part, for example, in order to realize another opening direction and another arrangement of the articulation device with respect to the lower housing part.

To allow, for example, the attachment of the housing to a wall or the like, the receiving borehole may be designed to receive stud bolts. These stud bolts, too, can be handled through the corresponding recess and are accessible especially for screwing purposes.

As a rule, two receiving boreholes and two articulation rods are sufficient to reliably mount and pivot the articulated cover relative to the lower housing part. However, to allow the use, for example, of receiving boreholes for stud bolts in addition to the arrangement of the articulation devices or, if necessary, to have several variations for pivotably mounting the articulated cover available, a number of receiving boreholes may be distributed in the housing wall over the circumferential direction of the housing. Normally, two of these receiving boreholes are used for the articulation device, while the other receiving boreholes are not used or can be used for screwing in stud bolts.

The housing may substantially be of any cross-section. In order to provide a closely adjacent arrangement of several housings, however, angular cross-sections are normally advantageous such as, for example, a quadrangular cross-section having two longitudinal sides and two transverse sides. If the cross-section is a square one, corresponding additional housings having respective dimensions may be disposed along all four sides in the direct vicinity thereof. This applies analogously also to rectangular, pentagonal or hexagonal cross-sections.

It is an advantage of such angular cross-sections if the corresponding receiving boreholes are formed in the housing wall substantially along connecting edges of the sides.

The corresponding stud bolts may also be used to assemble a lower housing part from a plurality of individual components. Thus, the stud bolts need not be inserted additionally for fixing the housing to a wall or the like.

In order to be able to screw the articulated cover, when the same is in a closed position, to the lower housing part, the lower side of the articulated cover may comprise boreholes substantially distributed and dimensioned to match at least some receiving boreholes. These boreholes in the articulated cover may also be formed as insertion cavities, which do not extend through to the upper side of the articulated cover.

However, if the boreholes of the articulated cover do extend through to the upper side thereof, they may substantially define a continuation of the receiving boreholes in the region of the articulated cover.

It is possible to arrange receiving boreholes separately for the articulation rods and separately for the stud bolts. In this connection it is advantageous, if the receiving boreholes for the articulation rods are disposed adjacent to receiving boreholes for stud bolts and both of them have common recesses. As a rule, four receiving boreholes for articulation rods along edges of the housing are sufficient if the housing has, for example, a quadrangular cross-section. These four receiving boreholes permit a pivotable mounting of the articulated cover along each side and, thus, an advantageous variation of the opening direction and articulation of the cover relative to the lower housing part.

If the aforementioned boreholes of the articulated cover are merely formed as insertion cavities, they can advantageously be used to provide insertion stubs on the lower side of the articulated cover, which are arranged along a side opposite to the upper articulation parts. These insertion stubs engage into upper openings of corresponding receiving boreholes when the articulated cover is in a closed position, so as to better define the closed position and improve the sealing between the articulated cover and the lower housing part.

A simple arrangement of the spring element during the assembly of the articulated cover and the lower housing part is particularly realized if one end of the spring element is fixed to a receptacle intermediate bottom which is disposed between two recesses formed one behind the other in the longitudinal direction of the borehole.

Moreover, it is possible that the receiving borehole extends through the receptacle intermediate bottom. In this case, the corresponding end of the spring element may also be fixed to the receiving borehole defined in the receptacle intermediate bottom.

Another possibility to fix the spring element in a simple manner to the articulation rod within the region of the recess resides in fixing the spring element to a lower free end of the articulation rod disposed in the receiving borehole, specifically in a detachable manner.

In order to be able to seal both the individual components of the housing used to form the lower housing part and the closed position sufficiently, particularly in view of explosion protection, sealing elements, especially silicone seals, may be arranged between the individual housing components of the lower housing part and between the lower housing part and the articulated cover, respectively.

As was set forth above, such a housing may be fixed to a wall or the like by means of the stud bolts. Also, additional devices on the outer side of the housing are conceivable, which permit, for example, a wall mounting, a grid channel mounting or a tube mounting.

To allow a better handling of the articulated cover during opening and closing it, the articulated cover may comprise recessed grips and/or gripping slots on its upper side.

If the receiving boreholes are used for the arrangement of stud bolts and thus, for example, for fixing the articulated cover to the lower housing part in the closed position, it may further be favorable if the receiving/articulated cover boreholes of the lower housing part or articulated cover, respectively, comprise a counterbore at their end away from the articulated cover and lower housing part, respectively. The stud bolt can be screwed into this counterbore so as not to project over the contour of the lower housing part or the articulated cover, respectively.

It is possible to fix the housing according to the invention separately to corresponding devices, e.g. switching and distribution stations, to corresponding slots or the like. However, due to the close arrangement of adjacent housings achieved with the housings according to the invention, they may additionally be connected to each other directly.

Below, an advantageous embodiment of the invention will be explained and described in more detail by means of the figures in the attached drawing.

Figure 1:
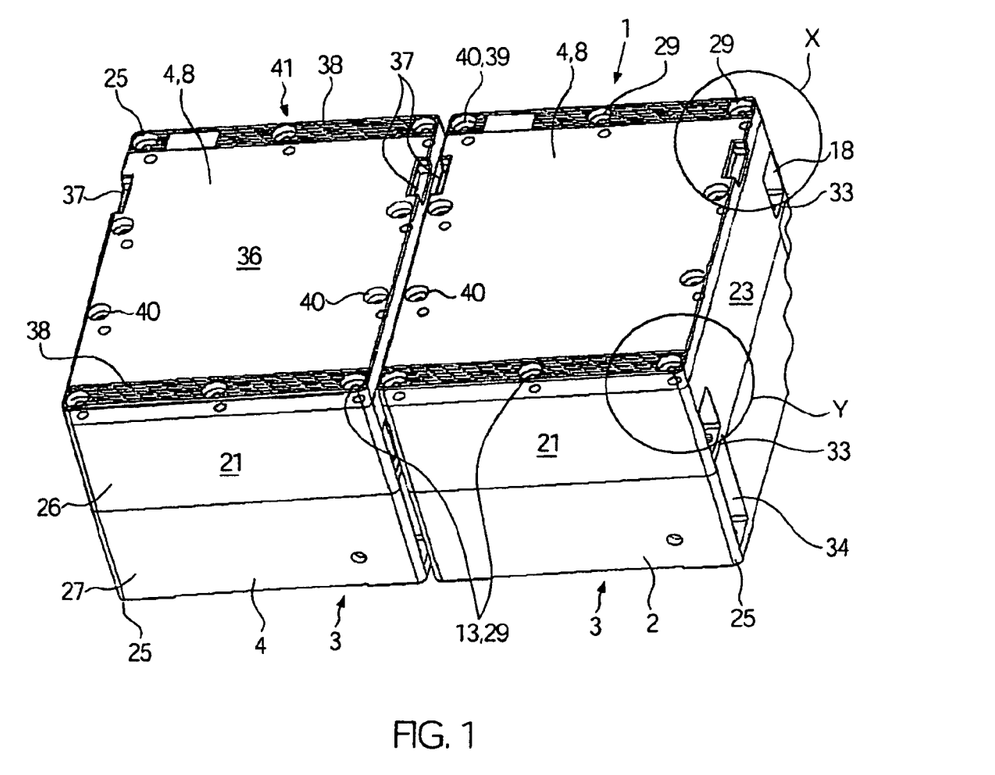
FIG. 1 shows a perspective, oblique top view of two housings according to the invention, which are arranged side by side.

FIG. 1 shows a perspective, oblique top and front view of two housings 1 and 41 arranged side by side. Each of these housings comprises a lower housing part 3 and an articulated cover 4 pivotably mounted on the same. The articulated cover 4 is mounted by means of an articulation device 6, also see the following figures, to be pivotable between an opened position 7 and the closed position 8 shown in FIG. 1.

On an upper side 36 of each articulated cover 4 a number of receiving boreholes 13, 29 are visible, which are defined within the region of the lower housing part 3 along corresponding connecting edges 25 of longitudinal and transverse sides 21, 23 of the housings 1 and 41, respectively. On the corresponding upper side 36, the receiving boreholes 29 are surrounded by a counterbore 40 at the end 39 away from the respective other part, i.e. the articulated cover and the lower housing part, respectively. This counterbore 40 serves to screw in corresponding stud bolts 19, see the following figures, so that these are provided in a countersunk manner and do not project over the corresponding contour of the articulated cover 4 and the housing 1 or 41, respectively. Moreover, the articulated cover 4 is provided with two oppositely arranged recessed grips 37 as well as with gripping slots 38 extending along the longitudinal sides 21 and 22, respectively. The longitudinal side 22 is placed opposite the longitudinal side 21 of FIG. 1 and will be described in more detail in the following figures. Analogously, the transverse sides 23 and 24 are placed opposite each other—see the following figures.

The integral lower housing part 3 comprises upper and lower housing halves 26 and 27. Individual housing halves could be connected to each other pressure-tight and, correspondingly, for the purpose of explosion protection by means of corresponding stud bolts 19. These stud bolts, or additional stud bolts 19, can likewise be employed to fix the articulated cover 4 in position when being in a closed position 8.

Adjacent to corresponding connecting edges 25, see for example transverse side 23 of the housing 1, recesses 18 and 34, which are open to the outer side 42 of the housing 1, are arranged above each other. These are separated from each other by a receptacle intermediate bottom 33. The receiving borehole 13 extends through the receptacle intermediate bottom 33, see the following figures, whereby the corresponding receiving borehole 29 may likewise extend through this receptacle intermediate bottom 33 to the lower side of the lower housing part 3.

Figure 4:
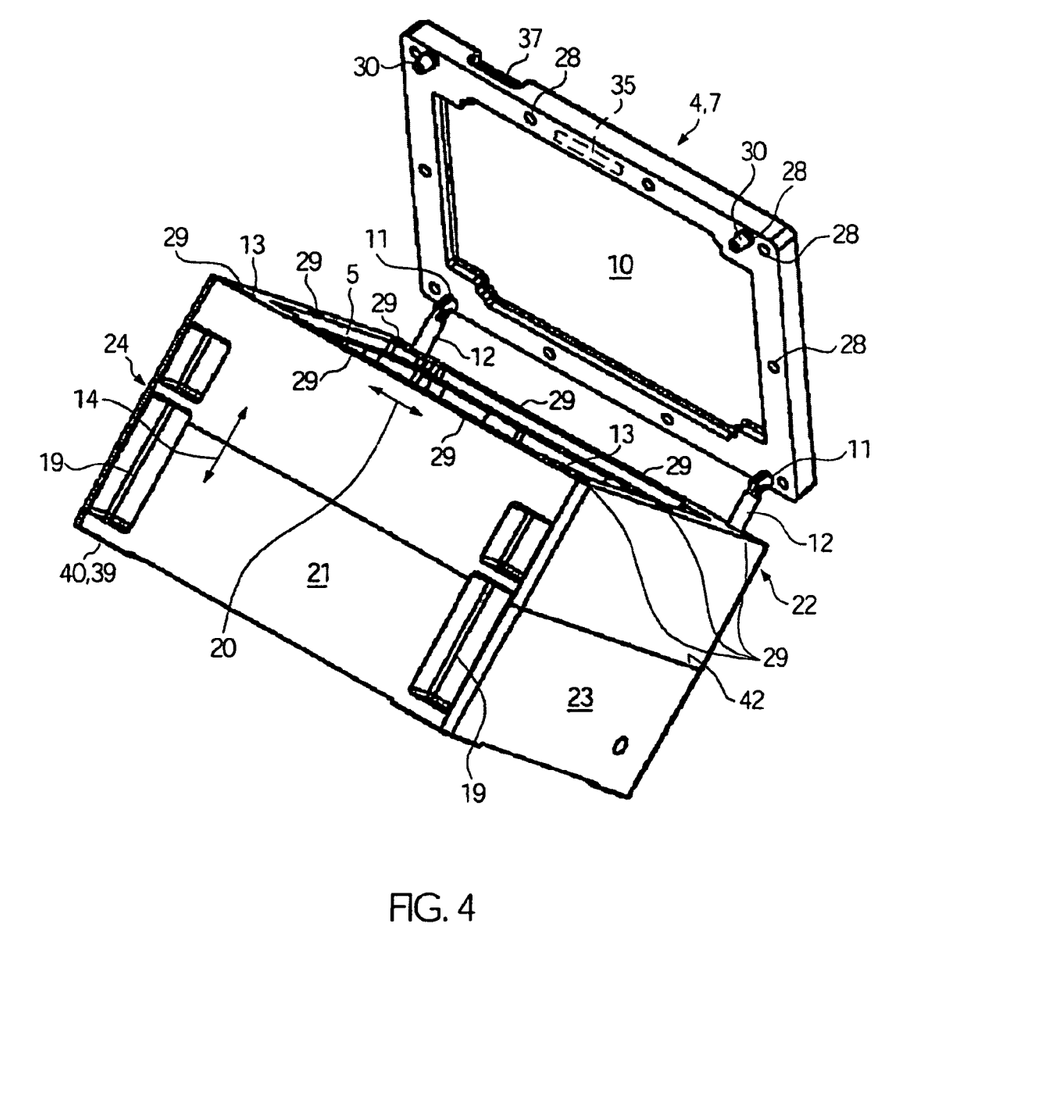
FIG. 4 shows a perspective, oblique front view of a housing with an articulated cover in an opened position.

As a whole, the longitudinal and transverse sides define a housing wall 2, which surrounds the housing 1 in circumferential direction 20, see, for example, FIG. 4.

Figure 2:
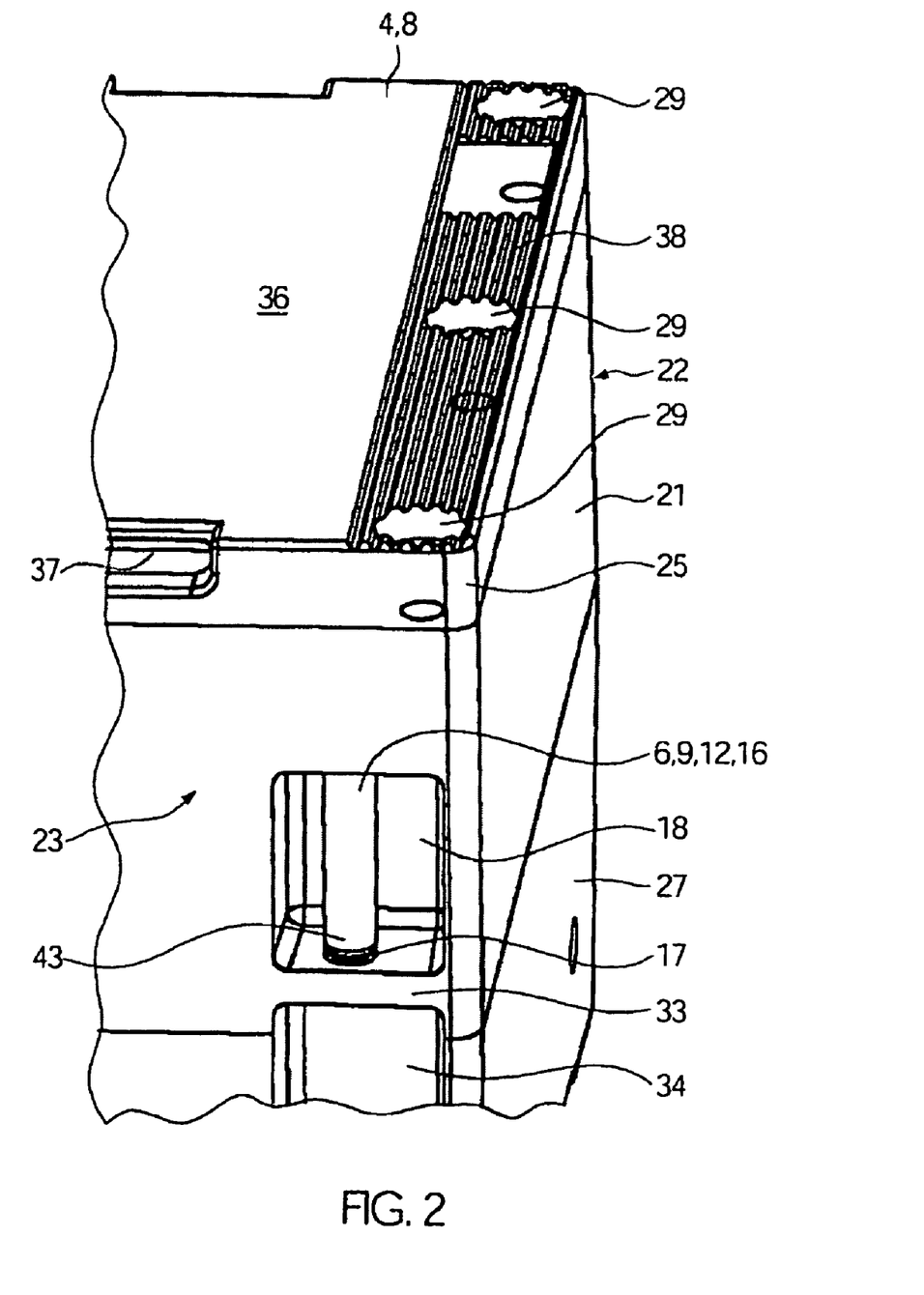
FIG. 2 shows an enlargement of a detail "X" of FIG. 1.

FIG. 2 corresponds to an enlarged representation of detail "X" of FIG. 1. In the upper recess 18, also see FIG. 1, FIG. 2 shows a lower articulation part 9, which forms part of the articulation device 6 and is formed as an articulation rod 12 and is arranged in a retracted position 16. In this retracted position 16, it is received substantially completely in the corresponding receiving borehole 13, also see FIGS. 4 and 5. For applying a force to the articulation rod 12 in the direction of the retracted position 16 a spring element 17 is arranged between a lower end 43 of the articulation rod 12 and the receptacle intermediate bottom 33. The articulation rod 12 is arranged inside the housing wall 2 or the transverse side 23, respectively, so that, according to the invention, no external or internal articulation device 6 is used, but an articulation device 6 which is arranged inside the housing wall 2.

The upper recess 18 particularly serves the mounting of the articulation device 6, that is, the articulation rod 12 with the spring element 17, and the fixation of the spring element 17 between the lower end 43 of the articulation rod 12 and the receptacle intermediate bottom 33.

For the sake of simplicity, FIG. 2 does not show a corresponding stud bolt 19, which can extend through the receiving borehole 29 and which would also be visible in recess 18 and recess 34, respectively.

A number of the corresponding receiving boreholes 29 are distributed along the circumferential direction 20, also see FIG. 1, whereby the boreholes 29 illustrated in the articulated cover 4 correspondingly continue to extend to the lower housing part 3 and, if necessary, also to the lower end of the lower housing part 3.

Figure 3:
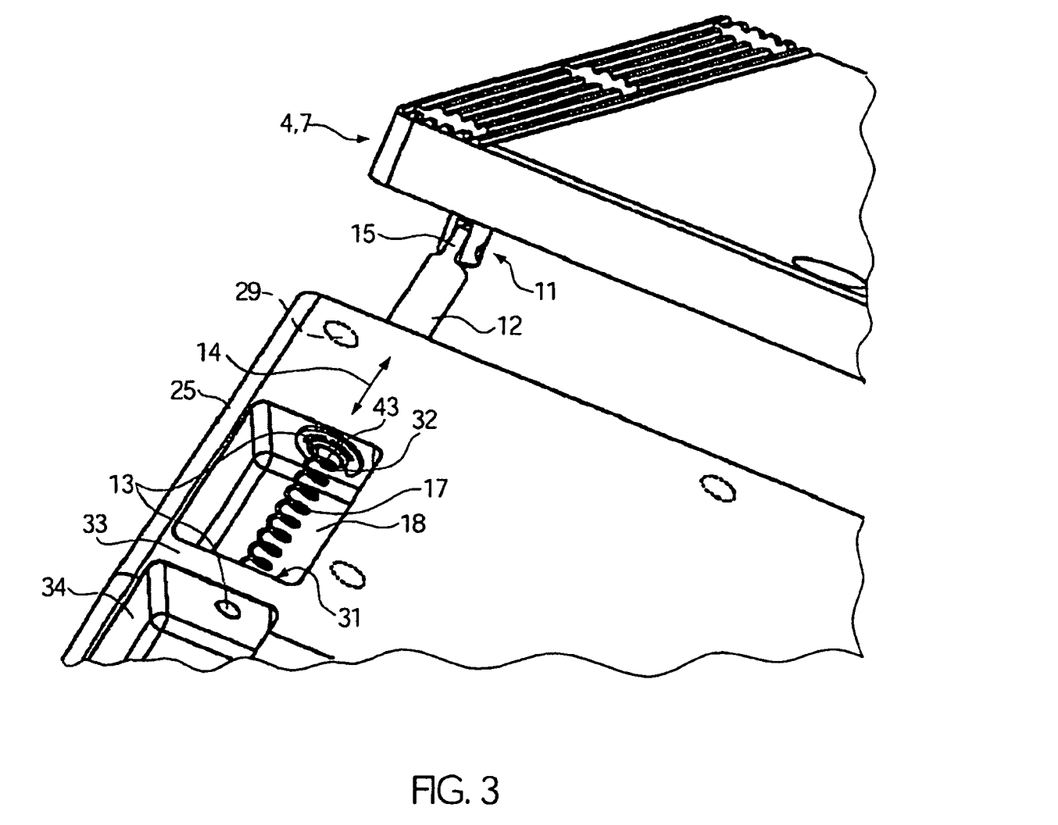
FIG. 3 shows an enlargement of a detail "Y" of FIG. 1 with an articulated cover in an opened position.

FIG. 3 illustrates an enlargement of detail "Y" of FIG. 1, with the articulated cover 4 being in an opened position 7, however. In this figure, like in the other figures, like parts are each designated with like reference numbers and are partly explained in more detail only in connection with a figure.

In the opened position 7 of the articulated cover 4 the articulation rod 12 is moved out of the retracted position 16 according to FIG. 2, and is displaced in the longitudinal direction of the borehole 14, specifically in the direction of the articulated cover 4. A corresponding restoring force in the direction of the retracted position 16 is exerted by the spring element 17 which, in FIG. 3, is mounted between the receptacle intermediate bottom 33 and the lower end 43 of the articulation rod 12. The lower end of 31 of the spring element 17 is fixed to the receptacle intermediate bottom 33, while its upper end 32 is fixed to the lower end 43 of the articulation rod 12.

Beside the receiving borehole 13, FIG. 3 also shows the arrangement of the dotted receiving borehole 29 for receiving a corresponding stud bolt 19, also see FIG. 4. This receiving borehole 29 may extend analogously along the corresponding connecting edge 25 and also through recesses 18 and 34.

The articulation end 15 of the articulation rod 12, which is formed as a connecting eye, is connected to an upper articulation part 11 of the articulation device 6. This upper articulation part 11 comprises a slot-shaped eye receptacle, into which the articulation end 15 is inserted and where it is pivotably mounted.

At this place it be pointed out that it is likewise possible that the spring element 17 applies a force to the articulation rod 12 towards the position shown in FIG. 3, so that the corresponding spring element 17 is substantially relaxed in FIG. 3, while being tensioned in FIG. 2, so as to push the articulation rod 12 out of the retracted position 16 according to FIG. 2 when the articulated cover 4 is opened.

FIG. 4 shows another embodiment of a housing 1, comprising an articulated cover 4 in an opened position 7. This housing 1 differs from the housing of FIG. 1 by the corresponding longitudinal sides 21, 22 being longer than the transverse sides 23, 24, so that a substantially rectangular cross-section is obtained, contrary to the substantially square cross-section according to FIG. 1. With this exception, the other features are congruent with each other.

In the opened position 7 of the articulated cover 4 according to FIG. 4, specifically the upper ends of the receiving boreholes 29 in the housing wall 2 are visible. Within the region of the connecting edges 25 between the different sides, receiving boreholes 13 for the adjustable mounting of the articulation rods 12 are arranged in the direct vicinity of these receiving boreholes 29.

As a rule, the articulated cover 4 is mounted on two of those articulation rods 12, also see FIG. 4, as articulation device 6, whereby also another arrangement of these articulation rods is possible, e.g. in the front receiving boreholes 13 of FIG. 4, so that in this case the articulated cover 4 is opened in a different direction. Moreover, it is possible with the housing 1 of FIG. 4 to mount the corresponding articulation rods 12 in the receiving boreholes 13 of transverse side 23 or transverse side 24, respectively, such that they are adjustable, so that in this case the articulated cover 4 can be opened and closed relative to a transverse side.

According to the invention, the recesses 18, 34 are provided within the region of all connecting edges 25 of the corresponding sides, which permit a retrofitting of the articulated cover 4 with any optional opening direction and any optional mounting relative to a side even after the installation of a corresponding housing 1 in another device or after the arrangement of another housing 41 in the direct vicinity of housing 1, also see FIG. 1.

In FIG. 4, a sealing element 35 is, in principle, illustrated on a lower side of the articulated cover 10, which can be, for example, a silicone seal.

Corresponding sealing elements 35 can also be provided between the individual housing components 26 and 27, see, in this respect, also FIG. 1.

The stud bolts within the receiving boreholes are visible particularly in FIG. 4. Those may be used for fixing the cover 4 in its closed position 8.

On the lower side of the articulated cover 10, the corresponding extensions of the receiving boreholes 13 and 29 are provided as articulated cover boreholes, which, in order to extend the receiving boreholes 13, are substantially formed as insertion cavities and in which corresponding insertion stubs 30 are disposed. When the articulated cover 4 is in a closed position 8, these stubs 30 engage into the open ends of the receiving boreholes 13 along corresponding transverse sides 23, 24 opposite to the receiving boreholes 13, in order to mount the articulation rods 12 in an adjustable manner.

These insertion stubs 30, too, can be arranged in other insertion cavities if the articulated cover 4 is mounted differently.

Figure 5:
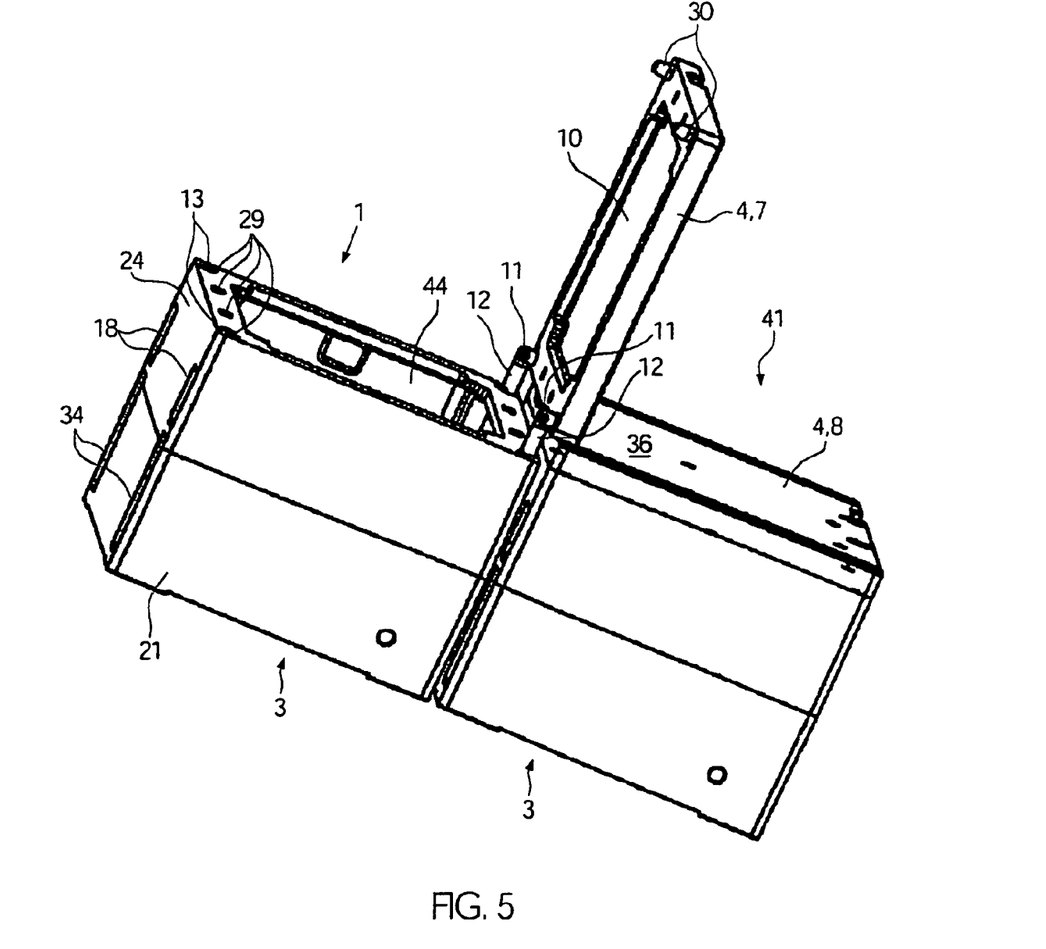
FIG. 5 shows a perspective view of two housings according to the invention arranged side by side, with one articulated cover of a housing being in an opened position.

FIG. 5 shows a perspective view of two housings 1 and 41, which have a cross-section in correspondence with the housing 1 of FIG. 4. However, the articulated covers 4 according to FIG. 5 are pivotably mounted along transverse sides 23 and 24 while, contrary to this, the articulated cover 4 in FIG. 4 is mounted along a longitudinal side 22.

In other respects, the features of FIG. 5 correspond to the previously described features of the other housings in the other figures. In FIG. 5 it is additionally recognizable that, in the opened position 7 of the articulated cover 4 of the housing 1, the articulated cover 4 rests with a transverse side on the upper side 36 of the articulated cover 4 of the housing 41. At least to this extent can the articulation rods 12 be drawn out of the corresponding receiving boreholes 13. It is possible that the articulated cover 4 automatically remains in the opened position 7 according to FIG. 5, without having to be held by an operator.

Analogously to the arrangement of the articulation rods 12, the corresponding insertion stubs 30 of FIG. 5 are likewise arranged along a transverse side 24, contrary to FIG. 4.

According to the invention, the arrangement of the articulation device 6 substantially inside the housing wall 2 achieves that the housings 1, 41, see for example FIGS. 1 and 5, can be arranged very closely adjacent to each other, as no external arrangement of the articulation device 6 is required. At the same time, the corresponding interior space 44 of the housing is not reduced by arranging the articulation device 6 therein, so that this space is entirely usable for the arrangement of electric or electronic components.

The invention claimed is:

1. An explosion-proof housing comprising:
   at least one lower housing part which is provided with a housing wall defining a housing opening; and
   an articulated cover configured to close the housing opening,
   wherein the articulated cover is mounted by an articulation device, and the articulated cover is pivotable between an opened and a closed position,
   wherein the articulation device comprises a lower articulation part in the form of an articulation rod arranged in a receiving borehole in the housing wall and an upper articulation part arranged on a lower side of the articulated cover which faces the housing opening in a closed position, the upper articulation part being directly pivotably interconnected with the lower articulation part, and
   wherein the upper articulation part and the articulation rod are arranged in a retracted position substantially inside a receiving borehole in the housing wall when the articulated cover is in the closed position.

2. The housing according to claim 1, wherein the articulation rod is at least partially inserted in the receiving borehole in the housing wall.

3. The housing according to claim 1, wherein the lower articulation part is mounted in the receiving borehole to be displaceable in a longitudinal direction of the borehole.

4. The housing according to claim 1, wherein an articulation end of the articulation rod projects out of the receiving borehole and is pivotably connected to the upper articulation part.

5. The housing according to claim 1, wherein the articulation rod together with the upper articulation part is arranged in a retracted position substantially inside the receiving borehole in a closed position.

6. The housing according to claim 1, wherein a force is applied to the articulation rod in the direction of the retracted position.

7. The housing according to claim 1, wherein the receiving borehole comprises at least one recess which is open substantially transversely to the longitudinal direction of the borehole toward the outer side of the housing wall.

8. The housing according to claim 1, wherein the receiving bore is formed to receive a stud bolt.

9. The housing according to claim 1, wherein a number of receiving boreholes are distributed in the housing wall in a circumferential direction of the housing.

10. The housing according to claim 1, wherein the housing has a quadrangular cross-section with two longitudinal sides and two transverse sides and receiving boreholes formed in the housing wall substantially along connecting edges of the sides.

11. The housing according to claim 1, wherein the lower housing part is assembled from a plurality of housing components by means of stud bolts.

12. The housing according to claim 1, wherein the lower side of the articulated cover comprises boreholes distributed and dimensioned to substantially match at least some of the receiving boreholes.

13. The housing according to claim 1, wherein the receiving borehole for the articulation rod is disposed adjacent to the receiving borehole for a stud bolt and both of them have common recesses.

14. The housing according to claim 1, wherein insertion stubs are arranged on the lower side of the articulated cover along a side opposite to the upper articulation parts.

15. The housing according to claim 1, wherein sealing elements comprising silicone seals are arranged between the lower housing part and the articulated cover.

16. The housing according to claim 1, wherein the housing is adapted to permit a wall mounting, a grid channel mounting or a tube mounting.

17. The housing according to claim 1, wherein the articulated cover is provided with recessed grips or gripping slots on its upper side.

18. The housing according to claim 1, wherein the receiving boreholes of the lower housing part or articulated cover, respectively, comprise a counterbore at their ends away from the articulated cover and lower housing part, respectively.

19. The housing according to claim 1, wherein the housing is detachably connectable to at least one other housing.

20. The housing according to claim 1, wherein a spring element is provided to apply a force.

21. The housing according to claim 20, wherein the spring element is arranged at or on the articulation rod and is fixed between the articulation rod and a portion of the receiving borehole.

22. The housing according to claim 20, wherein the spring element is formed as a helical spring.

23. The housing according to claim 20, wherein the spring element is detachably fixed to a lower end of the articulation rod disposed in the receiving borehole.

24. The housing according to claim 20, wherein one end of the spring element is fixed to a receptacle intermediate bottom disposed between two recesses formed one behind the other in the longitudinal direction of the borehole.

25. The housing according to claim 24, wherein the receiving borehole extends through the receptacle intermediate bottom.

* * * * *